(12) United States Patent
Fujimoto

(10) Patent No.: US 7,697,112 B2
(45) Date of Patent: Apr. 13, 2010

(54) EXPOSURE APPARATUS AND DEVICE MANUFACTURING METHOD

(75) Inventor: Kazuki Fujimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 624 days.

(21) Appl. No.: 11/387,530

(22) Filed: Mar. 23, 2006

(65) Prior Publication Data

US 2006/0215136 A1  Sep. 28, 2006

(30) Foreign Application Priority Data

Mar. 23, 2005 (JP) ............... 2005-084512
Mar. 17, 2006 (JP) ............... 2006-074413

(51) Int. Cl.
*G03B 27/42* (2006.01)
*G03B 27/52* (2006.01)

(52) U.S. Cl. ............... 355/53; 355/30; 355/67; 355/71

(58) Field of Classification Search ............ 355/53, 355/30, 67, 71
See application file for complete search history.

(56) References Cited

U.S. PATENT DOCUMENTS

2005/0168712 A1* 8/2005 Miyajima ............... 355/30
2005/0184248 A1* 8/2005 Kanazawa et al. ......... 250/372

FOREIGN PATENT DOCUMENTS

JP      09-320792      12/1997

* cited by examiner

*Primary Examiner*—Alan A Mathews
*Assistant Examiner*—Mesfin T Asfaw
(74) *Attorney, Agent, or Firm*—Cowan, Liebowitz & Latman, P.C.

(57) ABSTRACT

An exposure apparatus for exposing a substrate to light via a reticle includes a first plurality of optical elements configured to direct the light; a first vacuum chamber configured to accommodate said first plurality of optical elements; a first support configured to support said first vacuum chamber; and a second support configured to support at least one of said first plurality of optical elements substantially independently of said first support.

12 Claims, 7 Drawing Sheets

US 7,697,112 B2

EXPOSURE APPARATUS AND DEVICE MANUFACTURING METHOD

FIELD OF THE INVENTION

The present invention relates to an exposure apparatus for exposing a substrate to light via a reticle, and a device manufacturing method.

BACKGROUND OF THE INVENTION

Conventionally, in lithography to manufacture a semiconductor microdevice such as a semiconductor memory or logic circuit, reduction projection exposure using ultraviolet rays has been performed.

The minimum size that can be transferred by reduction projection exposure is proportional to the wavelength of light used for the transfer and inversely proportional to the numerical aperture of a projection optical system. Hence, in order to transfer a fine microcircuit pattern, light wavelength has been decreased. The wavelength of ultraviolet light is decreased as in mercury lamp i-line (wavelength: 365 nm), a KrF excimer laser (wavelength: 248 nm), and an ArF excimer laser (wavelength: 193 nm).

The feature size of semiconductor devices has been decreasing rapidly, and lithography using ultraviolet light has limitations in dealing with this trend. In order to print a very small microcircuit pattern of as small as less than 0.1 µm efficiently, a reduction projection exposure apparatus which uses extreme ultraviolet light (EUV light) having a wavelength of about 10 nm to 15 nm which is shorter than that of ultraviolet rays has been developed. Accordingly, an EUV light source to supply EUV light to an exposure apparatus is under development as described in Japanese Patent Laid-Open No. 9-320792.

The currently proposed exposure apparatus EUV light source mainly includes two types, i.e., the laser plasma (LPP) type and the discharge (DPP) type.

To transfer a microcircuit pattern, the optical axes of the light source and exposure apparatus must be aligned accurately, and the optical axes that are aligned once should be kept not to displace from each other.

Each of FIGS. 3 and 4 shows the positional relationship among the light-emitting point of a conventionally typical EUV light source, the connecting portion of the EUV light source to an exposure apparatus, the position of the focal point, and the positions of the mirrors of an illumination optical system.

FIG. 3 is a view showing a portion in the vicinity of the connecting portion of an exposure apparatus and a DPP type EUV light source which emits EUV light.

Referring to FIG. 3, reference numeral 1 denotes a light source chamber; and 2, an exposure apparatus chamber. A connecting flange 3 of the light source chamber 1 and connecting flange 4 of the exposure apparatus chamber 2 are fastened and fixed to each other with a hexagonal bolt or the like (not shown). In the light source chamber 1, plasma light emitted from a light-emitting portion 5 is reflected by a multilayered film mirror 6 and focused on a focal point 7 of the connection surface of the two chambers 1 and 2. The focused light diverges again and is reflected by a concave mirror 28 of the exposure apparatus so as to form parallel light.

The light-emitting portion 5 and multilayered film mirror 6 are fixed to a base (not shown) arranged in the light source chamber 1. The mirror 28 of the exposure apparatus is fixed to a base (not shown) arranged in the exposure apparatus chamber 2. The position of the focal point 7 is determined by a focal point aperture arranged in the exposure apparatus chamber 2. Usually, the focal point 7 is set on the connection boundary surface of the light source chamber 1 and exposure apparatus chamber 2, as shown in FIG. 3.

FIG. 4 is a view showing another conventional example which uses an LPP type EUV light source.

Referring to FIG. 4, reference numeral 1 denotes a light source chamber; and 2, an exposure apparatus chamber. A connecting flange 3 of the light source chamber 1 and connecting flange 4 of the exposure apparatus chamber 2 are fastened and fixed to each other with a hexagonal bolt (not shown) or the like. This structure is identical to that of FIG. 3.

In the light source chamber 1, plasma light emitted from a light-emitting portion 5 is reflected by a multilayered film mirror 6 and focused on a focal point 7 of the boundary surface of the light source chamber 1 and exposure apparatus chamber 2.

In the exposure apparatus chamber 2, reference numeral 39 denotes a pair of Schwarzschild-type mirrors. Of the mirrors 39, one convex mirror 39a has a hole which is formed at its center and set on the boundary surface where the light source chamber 1 and exposure apparatus chamber 2 are connected. The hole (aperture) of the convex mirror 39a coincides with the focal point 7. Light focused on the focal point 7 diverges again and is reflected by the other concave mirror 39b, and is reflected again by the convex mirror 39a so as to form parallel light.

The conventional example described above has the following problems. More specifically, the light-emitting portion 5 of the light source, the focusing optical system 6, and the aperture of the focal point 7 are fixed to a support in the light source chamber 1, and a mirror 8 of an illumination optical system is fixed to a support in the exposure apparatus chamber 2. If pressures in the respective chambers fluctuate, the corresponding chambers deform, and the relative positions of optical components which are adjusted in advance may displace.

The aperture to determine the position of the focal point 7 is located on the flange 3, i.e., on the connection boundary surface of the light source chamber 1 and exposure apparatus chamber 2. Therefore, a member to fix the aperture must be set in the flange 3 and is thus difficult to attach.

SUMMARY OF THE INVENTION

The present invention has been made in view of the above background, and has as its exemplary object to decrease a relative positional deviation among optical elements caused by change in pressure in a chamber.

In order to solve the above problem and to achieve the above object, according to the first aspect of the present invention, there is provided an exposure apparatus for exposing a substrate to light via a reticle, comprising: a first plurality of optical elements configured to direct the light; a first vacuum chamber configured to accommodate the first plurality of optical elements; a first support configured to support the first vacuum chamber; and a second support configured to support at least one of the first plurality of optical elements substantially independently of the first support.

According to the above aspect, the apparatus further comprises a second plurality of optical elements configured to direct the light; a second vacuum chamber configured to accommodate the second plurality of optical elements; a third support configured to support the second vacuum chamber; and a fourth support configured to support at least one of the second plurality of optical elements substantially independently of the third support, wherein the first vacuum chamber and the second vacuum chamber are connected to each other through respective flanges thereof.

According to the above aspect, the first support is configured to allow at least one of displacement and deformation of the first vacuum chamber.

According to the above aspect, the first support includes a bellows.

According to the above aspect, the third support is configured to allow at least one of displacement and deformation of the second vacuum chamber.

According to the above aspect, the third support includes a bellows.

According to the above aspect, the second support extends through a wall of the first vacuum chamber, and the apparatus further comprises a seal mechanism configured to seal a gap between the second support and the wall and to allow relative displacement between the second support and the wall.

According to the above aspect, the fourth support extends through a wall of the second vacuum chamber, and the apparatus further comprises a seal mechanism configured to seal a gap between the fourth support and the wall and to allow relative displacement between the fourth support and the wall.

According to the above aspect, the first plurality of optical elements include at least one of a light source, a reflective optical element, and an aperture.

According to the above aspect, the second plurality of optical elements include at least one of a light source, a reflective optical element, and an aperture.

According to the above aspect, the second plurality of optical elements include an aperture, and the aperture is arranged apart from the flange of the second vacuum chamber.

According to the above aspect, the first plurality of optical elements include an extreme ultraviolet light source.

According to the second aspect of the present invention, there is provided a method of manufacturing a device, comprising steps of: exposing a substrate to light via a reticle using an exposure apparatus as defined above; developing the exposed substrate; and processing the developed substrate to manufacture the device.

As has been described above, according to the present invention, a relative positional displacement among the optical components caused by, e.g., a pressure change in the chamber, can be decreased.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

The preferred embodiments of the present invention will be described in detail with reference to the accompanying drawings.

The embodiments to be described hereinafter are examples as a means to implement the present invention, and should be appropriately modified or changed depending on the arrangement and various conditions of an apparatus to which the present invention is to be applied.

First Embodiment

Figure 1:
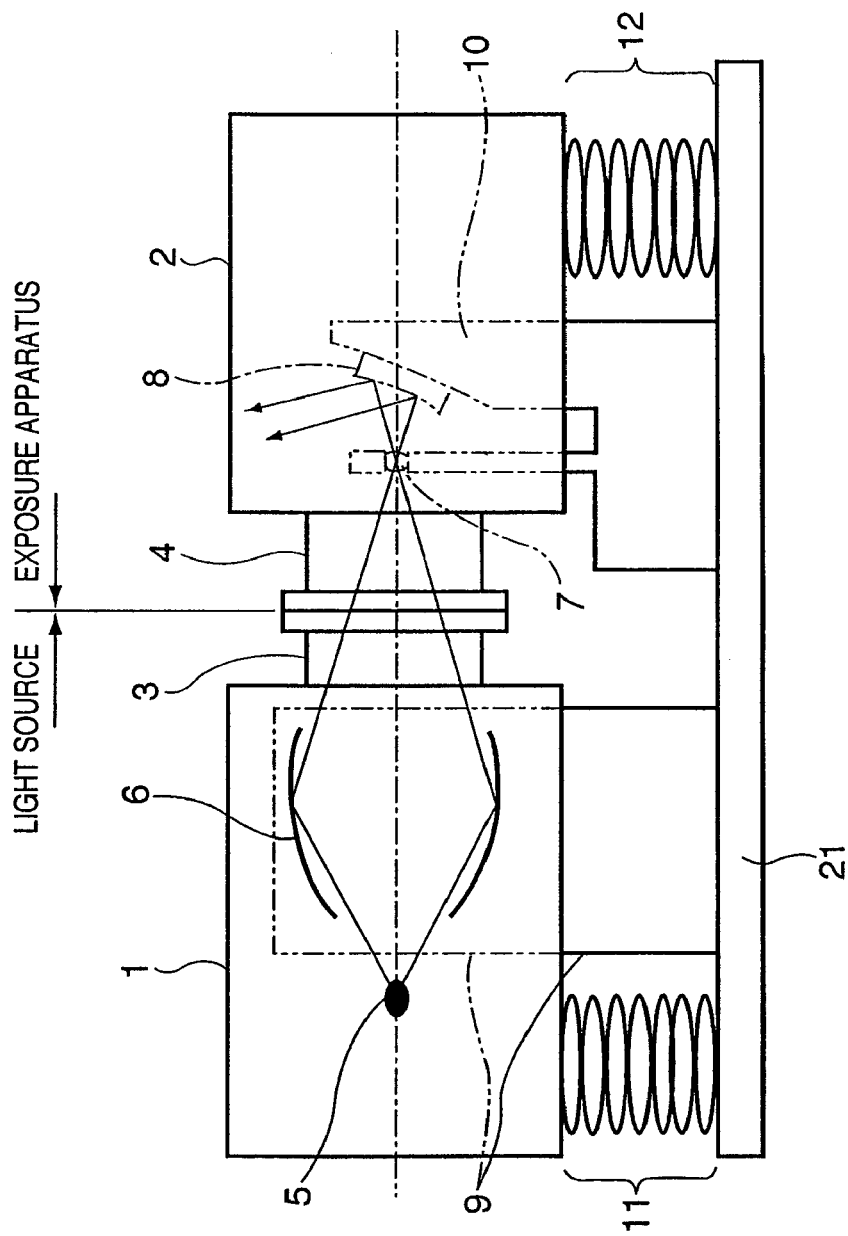
FIG. 1 is a view showing a portion in the vicinity of the connecting portion of a light source apparatus and exposure apparatus according to the first embodiment of the present invention.

FIG. 1 is a view showing a portion in the vicinity of the connecting portion of a light source and exposure apparatus according to the first embodiment of the present invention.

Figure 3:
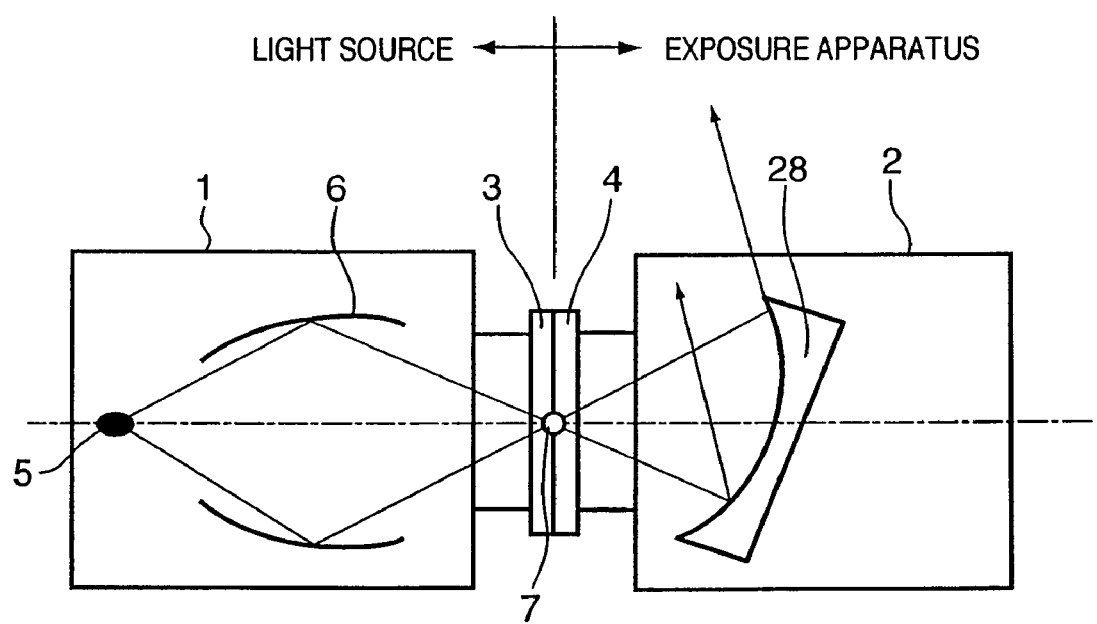
FIG. 3 is a view showing a portion in the vicinity of the connecting portion of a conventional light source apparatus and exposure apparatus.

Referring to FIG. 1, reference numeral 1 denotes a light source chamber; and 2, an exposure apparatus chamber. A connecting flange 3 of the light source chamber 1 and connecting flange 4 of the exposure apparatus chamber 2 are fastened and fixed to each other with a hexagonal bolt (not shown) or the like. This structure is identical to that shown in FIG. 3. The light source size is 10 mm in diameter, and NA=0.25. The distance between a light-emitting portion 5 and focal point 7 is 1,000 mm. The flange sizes of the light source chamber 1 and exposure apparatus chamber 2 are ICF152.

A reference base 21 is arranged outside the two chambers 1 and 2 to be shared by the light source and exposure apparatus. A support 9 which supports a multilayered film mirror 6, and a support 10 which supports a mirror 8 of the exposure apparatus (illumination optical system) and the aperture of the focal point 7 are reliably fixed by a fastening member such as a screw after optical axis alignment. Each support extends through the corresponding chamber. The gap between the support and chamber is sealed by a seal mechanism (not shown) which allows relative displacement between the support and chamber. The aperture of the focal point 7 is arranged in the exposure apparatus chamber 2, which is downstream of the flange 4 in the light traveling direction, to be upstream of the downstream mirror 8 which forms parallel light.

The light source chamber 1 is fixed to a reference base 21 through a bellows (a bellows-type support or a support which is configured to allow displacement and/or deformation of a support target) 11 serving as a buffer. The exposure apparatus chamber 2 is fixed to the reference base 21 through a bellows (bellows-type support) 12 serving as a buffer. The interiors of the two chambers 1 and 2 are vacuum, and the light-emitting portion 5 emits EUV light. In the light source chamber 1, EUV light emitted from the light-emitting portion 5 is reflected by the multilayered film mirror 6 and focused on the focal point 7 in the exposure apparatus chamber 2. The focused light diverges again and is reflected by the concave mirror 8 in the exposure apparatus so as to form parallel light.

When pressures in the light source chamber 1 and exposure apparatus chamber 2 change, the bellows 11 and 12 deform to displace the positions of the light source chamber 1 and exposure apparatus chamber 2. The relative positions of the multilayered film mirror 6 supported by the reference base 21, the mirror 8, and the aperture of the focal point 7 are maintained regardless of the displacement caused by the pressures of the chambers. More specifically, since the respective supports 9 and 10 are supported on the reference base 21 independently of the respective chambers 1 and 2, the relative positions of the multilayered film mirror 6 supported on the reference base 21, the mirror 8, and the aperture of the focal point 7 do not change, while the light source chamber 1 and exposure apparatus chamber 2 displace relative to the reference base 21 due to the pressure change.

The focal point 7 of the light source is located at 100 mm downstream of the boundary surface of the light source chamber 1 and exposure apparatus chamber 2. The flanges 3 and 4 have thicknesses of 70 mm, and the focal point 7 is located not on any flange but in the chamber 2. Thus, the supports can be set easily.

Second Embodiment

Figure 2:
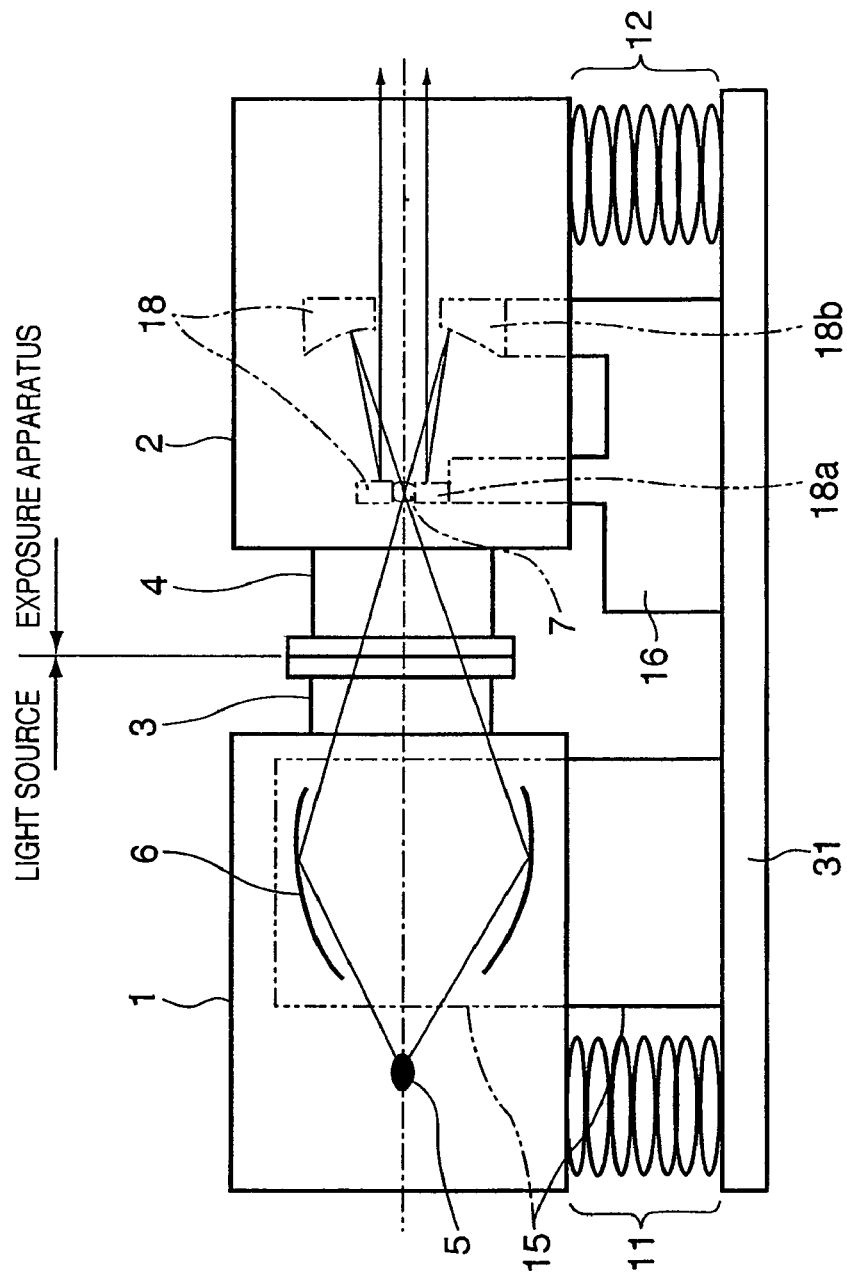
FIG. 2 is a view showing a portion in the vicinity of the connecting portion of a light source apparatus and exposure apparatus according to the second embodiment of the present invention.

FIG. 2 is a view showing a portion in the vicinity of the connecting portion of a light source and exposure apparatus according to the second embodiment of the present invention. The same elements as in FIG. 1 are denoted by the same reference numerals.

Figure 4:
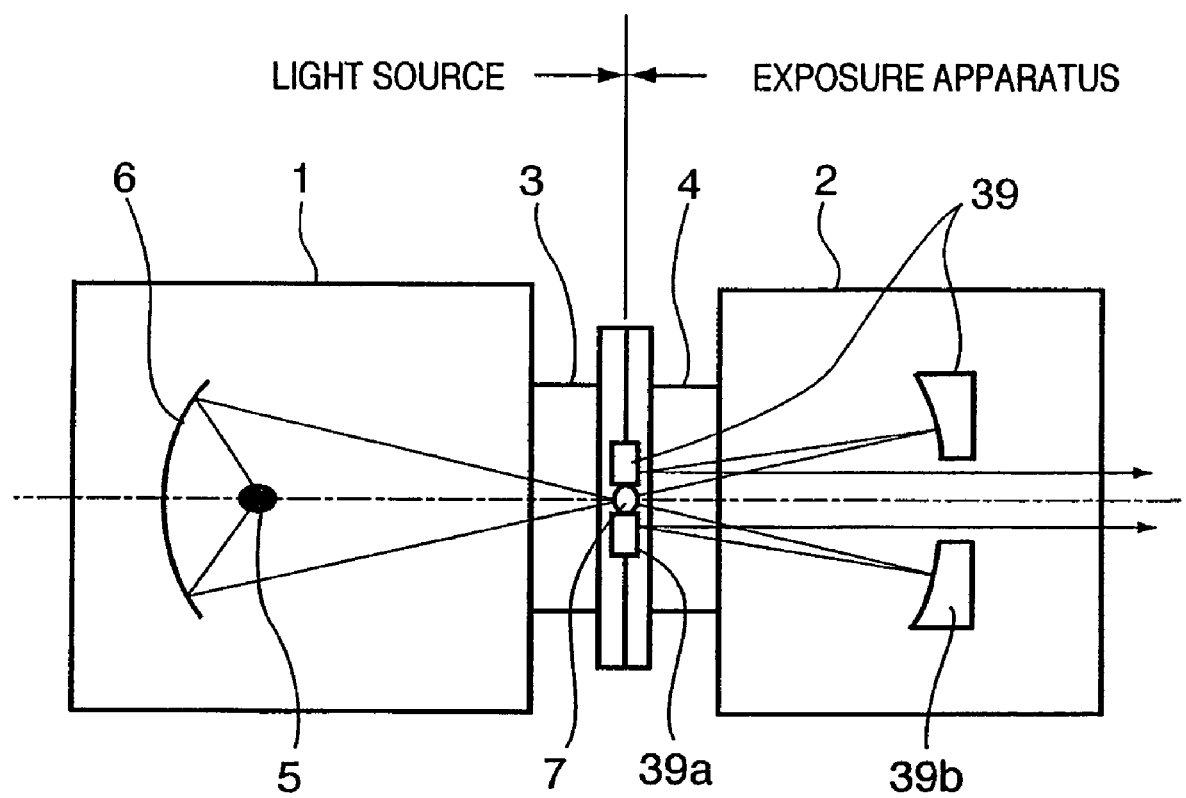
FIG. 4 is a view showing a portion in the vicinity of the connecting portion of conventional light source apparatus and exposure apparatus.

Referring to FIG. 2, reference numeral 1 denotes a light source chamber; and 2, an exposure apparatus chamber. A connecting flange 3 of the light source chamber 1 and connecting flange 4 of the exposure apparatus chamber 2 are fastened and fixed to each other with a hexagonal bolt or the like (not shown). This structure is identical to that shown in FIG. 4. The light source size is 12 mm in diameter, and NA=0.2. The distance between a light-emitting point 5 and focal point 7 is 1,000 mm. The flange sizes of the light source chamber 1 and exposure apparatus chamber 2 are ICF152.

A reference base 31 is arranged outside the two chambers 1 and 2 to be shared by the light source and exposure apparatus. A support 15 which supports a multilayered film mirror unit 6, and a support 16 which supports two Schwarzschild-type mirrors 18 and a focal point focal point aperture 17 are reliably fixed on the reference base 31 by a fastening member such as a screw after optical axis alignment. Each support extends through the wall of the corresponding chamber. The gap between the support and chamber is sealed by a seal mechanism (not shown) which allows relative displacement between the support and chamber.

In the exposure apparatus chamber 2, reference numeral 18 denotes a pair of Schwarzschild-type mirrors. The focal point 7 of the mirrors 18 is formed on an aperture arranged at the center of one convex mirror 18a. The aperture of a concave mirror 18b coincides with the focal point 7. Light focused on the focal point 7 diverges again, reflected by the other concave mirror 18b, and is reflected by the convex mirror 18a again so as to form parallel light.

The light source chamber 1 is fixed to the reference base 31 through a bellows (bellows-type support) 11. The exposure apparatus chamber 2 is fixed to the reference base 31 through a bellows (bellows-type support) 12. In the light source chamber 1, EUV light emitted from the light-emitting portion 5 is reflected by the multilayered film mirror 6 and focused on the focal point 7 in the exposure apparatus chamber 2.

When pressures in the light source chamber 1 and exposure apparatus chamber 2 change, the bellows 11 and 12 deform to displace the positions of the light source chamber 1 and exposure apparatus chamber 2. The relative positions of the multilayered film mirror 6 supported by the reference base 31 and the two Schwarzschild-type mirrors 18 are maintained regardless of the displacement caused by the pressures of the chambers. More specifically, since the respective supports 15 and 16 are supported on the reference base 31 independently of the respective chambers 1 and 2, the relative positions of the multilayered film mirror 6 supported on the reference base 31, the Schwarzschild-type mirrors 18, and the aperture of the focal point 7 do not change, while the light source chamber 1 and exposure apparatus chamber 2 displace relative to the reference base 31 due to the pressure change.

The focal point 7 of the light source is located at 100 mm downstream of the boundary surface of the light source chamber 1 and exposure apparatus chamber 2. The flanges 3 and 4 have thicknesses of 70 mm, and the focal point 7 is located not on any flange but in the chamber 2. Thus, the supports can be set easily. The second embodiment is different from the first embodiment in that the optical axis of the parallel beam is parallel to the optical axis of the light-emitting portion 5.

Exposure Apparatus

Figure 5:
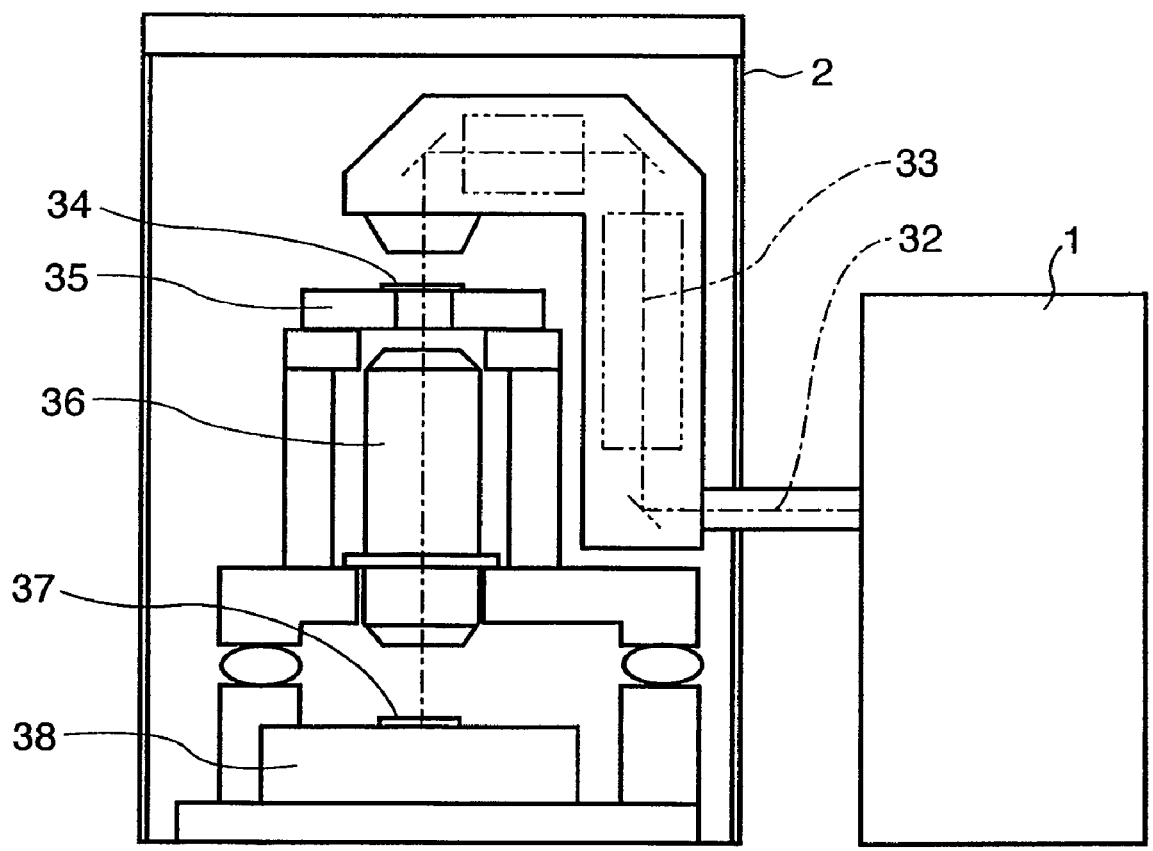
FIG. 5 is a view showing an exposure apparatus.

FIG. 5 shows the schematic arrangement of the exposure apparatus. Reference numeral 1 denotes the light source chamber of the exposure apparatus shown in FIG. 1 or 2. Reference numeral 2 denotes the exposure apparatus chamber. The two chambers 1 and 2 are arranged on a reference base (not shown).

Light emerging from the light source chamber 1 is guided to an illumination optical system 33 in the exposure apparatus chamber 2 via a guide portion 32 comprising the flanges 3 and 4. The illumination optical system 33 removes illuminance nonuniformities and forms a beam. The beam serves as illumination light to irradiate a reticle 34 serving as an original. The reticle 34 is arranged on a reticle stage 35.

A pattern formed on the reticle 34 is reduced and projected onto a wafer 37, which is arranged on a plane optically conjugate to the reticle 34, via a projection optical system 36. In FIG. 5, the illumination light is transmitted through the reticle 34. As the illumination light is EUV light, it is practical to employ a reflective reticle and guide the light reflected by the reflective reticle by a projection optical system. It is practical to form the projection optical system with a reflective optical element (mirror).

The wafer 37 is arranged on a wafer stage 38 driven by a linear motor, and is exposed repeatedly by step & repeat. Alternatively, an illumination area on the reticle 34 may be narrowed to form a slit. The reticle stage 35 may be driven by a linear motor. The wafer 37 may be exposed while scanning the wafer stage 38 and reticle stage 35 simultaneously.

Device Manufacturing Method

Figure 6:
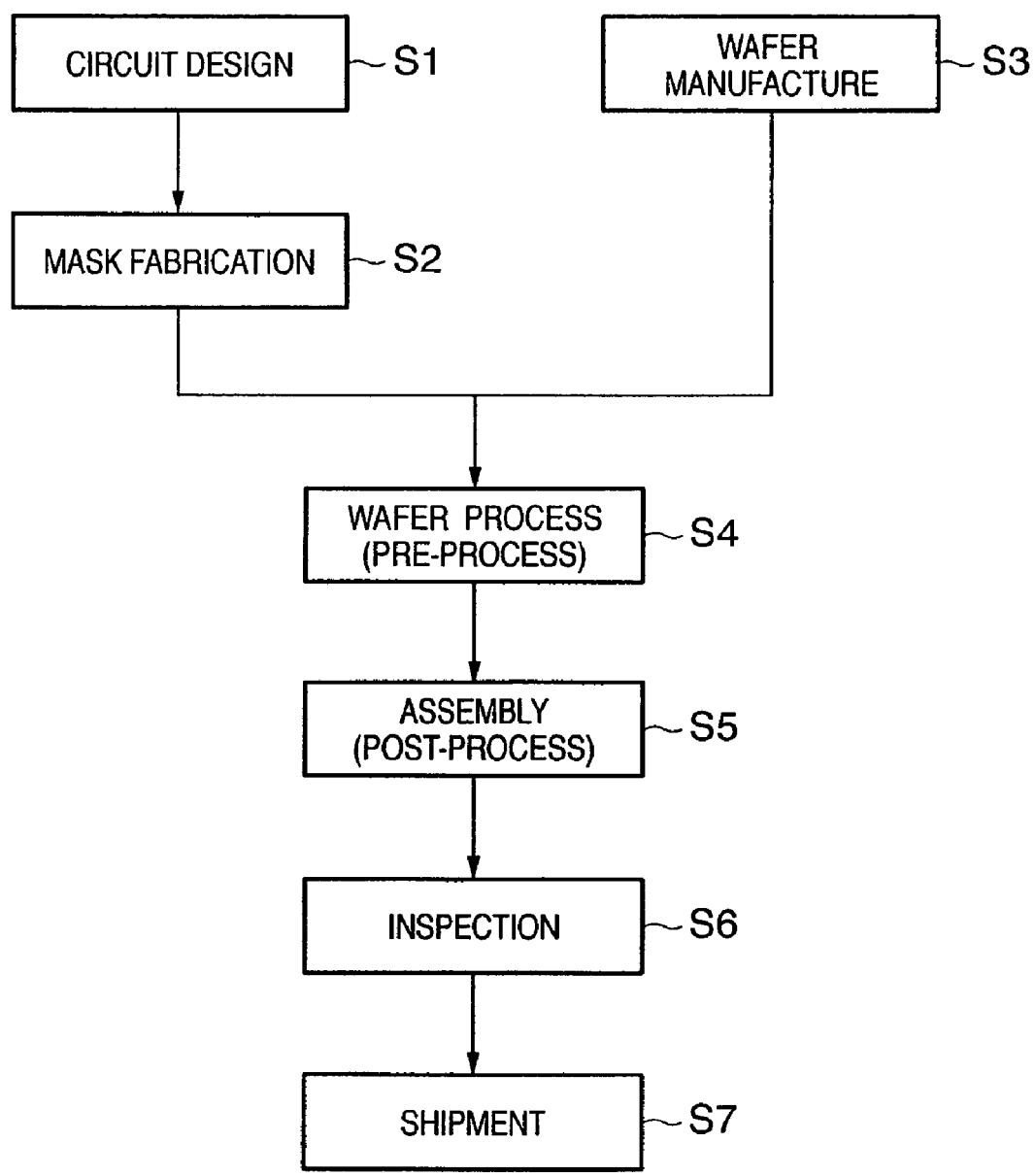
FIG. 6 is a flowchart showing a device manufacturing method.

A semiconductor device manufacturing process which uses this exposure apparatus will be described. FIG. 6 is a flowchart showing an entire semiconductor device manufacturing process. In step S1 (circuit design), the circuit of a semiconductor device is designed. In step S2 (mask fabrication), a mask (also called a reticle) is fabricated on the basis of the designed circuit pattern.

In step S3 (wafer manufacture), a wafer is manufactured using a material such as silicon. In step S4 (wafer process) called a preprocess, an actual circuit is formed on the wafer by the exposure apparatus described above in accordance with lithography using the mask and wafer described above. In the next step S5 (assembly) called a post-process, a semiconductor chip is formed from the wafer fabricated in step S5. This step includes processes such as assembly (dicing and bonding) and packaging (chip encapsulation). In step S6 (inspection), inspections such as operation check test and durability test of the semiconductor device fabricated in step S5 are performed. A semiconductor device is finished with these steps and shipped in step S7.

Figure 7:
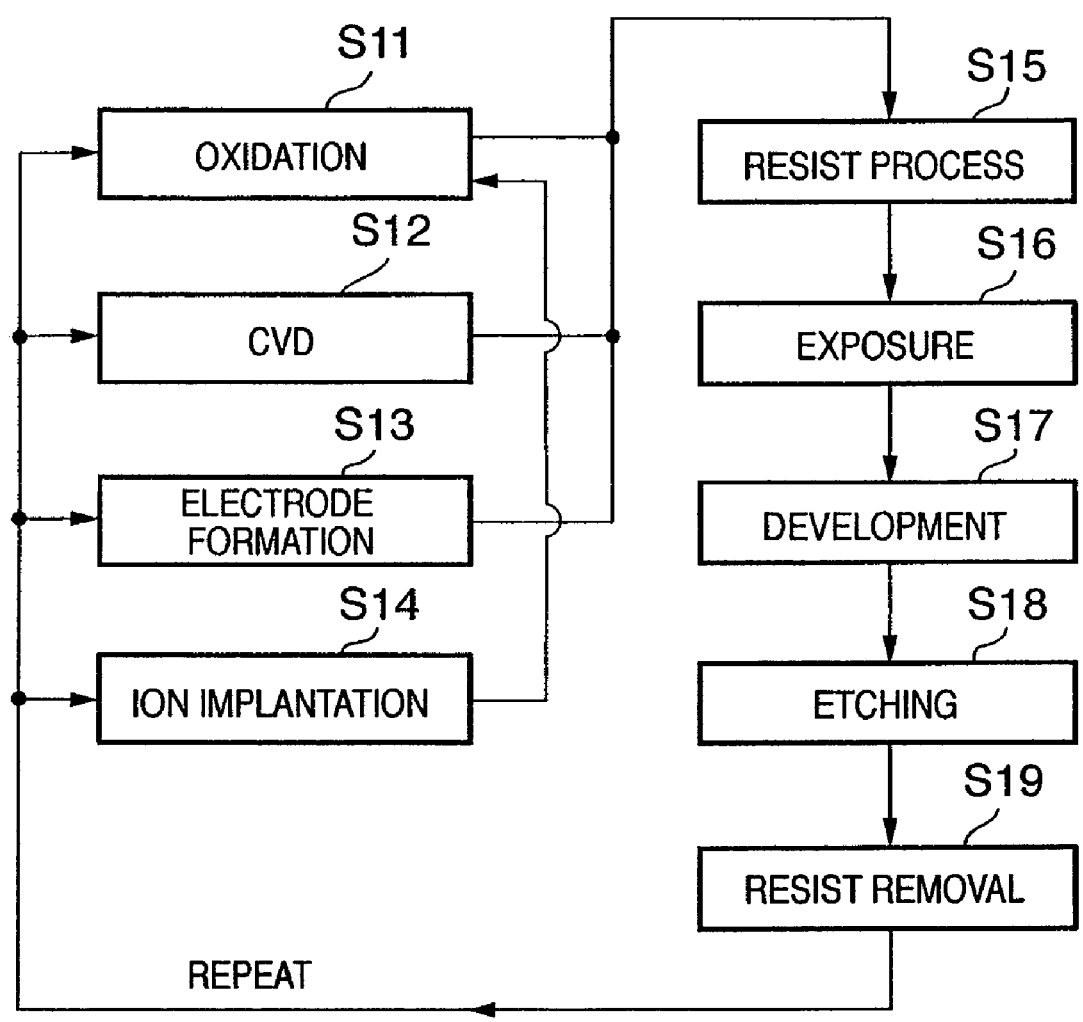
FIG. 7 is a flowchart showing a wafer process.

The wafer process of step S4 has the following steps (FIG. 7), i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of exposing the wafer, after the resist process step, by using the exposure apparatus via the circuit pattern formed on the mask, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

According to the above embodiments, the focusing mirror 6, the aperture of the focal point 7, and the mirror 8 or 18 of the illumination optical system which serve as an optical system and guide light emitted from the light source are supported by the common reference base 21 or 31 arranged outside the chambers 1 and 2. Thus, the relative positions of the respective optical components can be maintained without being adversely affected by the pressure fluctuation in the light source chamber or exposure apparatus chamber.

The aperture of the focal point 7 is arranged in the exposure apparatus chamber 2, which is downstream of the flange 4, to be upstream of the most-upstream mirror 8 or mirrors 18 in the exposure apparatus chamber 2. The focusing mirror 6, the aperture of the focal point 7, and the mirror 8 or mirrors 18 of the illumination optical system can be set through the reference base 21 or 31. Thus, the light source chamber 1 and exposure apparatus chamber 2 can be assembled greatly easily.

Schwarzschild-type mirrors are used as the mirrors of the illumination optical system. The focal point 7 is arranged downstream of the flange 4 in the exposure apparatus chamber 2 and upstream of the most-upstream mirror 8 or mirrors 18. Thus, the parallel light becomes parallel to the optical axis of the light source, and the degrees of freedom in design of the apparatus can be increased.

As many apparently widely different embodiments of the present invention can be made without departing from the spirit and scope thereof, it is to be understood that the invention is not limited to the specific embodiments thereof except as defined in the appended claims.

This application claims the benefit of Japanese Application No. 2005-084512, filed Mar. 23, 2005, 2006-074413, filed Mar. 17, 2006, which are hereby incorporated by reference herein in their entirety.

What is claimed is:

1. An exposure apparatus for exposing a substrate to light via a reticle, said apparatus comprising:
   a first plurality of optical elements configured to direct the light;
   a first vacuum chamber configured to accommodate said first plurality of optical elements;
   a base;
   a first support configured to support said first vacuum chamber on said base, said first support including bellows so as to allow at least one of displacement and deformation of said first vacuum chamber; and
   a second support configured to support at least one of said first plurality of optical elements on said base substantially independently of said first support.

2. An apparatus according to claim 1, further comprising:
   a second plurality of optical elements configured to direct the light;
   a second vacuum chamber configured to accommodate said second plurality of optical elements;
   a third support configured to support said second vacuum chamber on said base; and
   a fourth support configured to support at least one of said second plurality of optical elements on said base substantially independently of said third support,
   wherein said first vacuum chamber and said second vacuum chamber are connected to each other through respective flanges thereof.

3. An apparatus according to claim 2, wherein said third support is configured to allow at least one of displacement and deformation of said second vacuum chamber.

4. An apparatus according to claim 3, wherein said third support includes a bellows.

5. An apparatus according to claim 1, wherein
   said second support extends through a wall of said first vacuum chamber, and
   said apparatus further comprises a seal mechanism configured to seal a gap between said second support and said wall and to allow relative displacement between said second support and said wall.

6. An apparatus according to claim 2, wherein
   said fourth support extends through a wall of said second vacuum chamber, and
   said apparatus further comprises a seal mechanism configured to seal a gap between said fourth support and said wall and to allow relative displacement between said fourth support and said wall.

7. An apparatus according to claim 2, wherein said first plurality of optical elements include a light source and a reflective optical element.

8. An apparatus according to claim 7, wherein said second plurality of optical elements include at least one of a reflective optical element and an aperture.

9. An apparatus according to claim 8, wherein said second plurality of optical elements include an aperture, and said aperture is arranged apart from said flange of said second vacuum chamber.

10. An apparatus according to claim 1, wherein said first plurality of optical elements include an extreme ultraviolet light source.

11. A method of manufacturing a device, said method comprising steps of:
    exposing a substrate to light via a reticle using an exposure apparatus as defined in claim 1;
    developing the exposed substrate; and
    processing the developed substrate to manufacture the device.

12. An apparatus according to claim 9, wherein said apparatus is configured such that the light emitted from said light source is reflected by said reflective optical element in said first vacuum chamber and focused in said second vacuum chamber on a focal point at which said aperture is arranged.

* * * * *